(12) United States Patent
Lu et al.

(10) Patent No.: US 8,383,518 B1
(45) Date of Patent: Feb. 26, 2013

(54) METHOD FOR FORMING CONTACT HOLES

(75) Inventors: Wen-Cheng Lu, Taoyuan County (TW);
Yang-Yu Yao, Taoyuan County (TW)

(73) Assignee: Chunghwa Picture Tubes, Ltd.,
Taoyuan (TW)

( * ) Notice: Subject to any disclaimer, the term of this patent is extended or adjusted under 35 U.S.C. 154(b) by 0 days.

(21) Appl. No.: 13/325,905

(22) Filed: Dec. 14, 2011

(30) Foreign Application Priority Data

Aug. 16, 2011 (TW) .............................. 100129243 A

(51) Int. Cl.
*H01L 21/311* (2006.01)
(52) U.S. Cl. ........ 438/700; 438/597; 438/618; 438/637; 257/E21.249
(58) Field of Classification Search ................... 438/637, 438/700; 257/E21.249
See application file for complete search history.

(56) References Cited

U.S. PATENT DOCUMENTS

| 8,110,830 | B2 * | 2/2012 | Lim et al. ........................ 257/59 |
| 2002/0074549 | A1 * | 6/2002 | Park et al. ....................... 257/59 |
| 2002/0197539 | A1 * | 12/2002 | Park et al. ........................ 430/1 |
| 2007/0052885 | A1 | 3/2007 | Tanaka |
| 2010/0087021 | A1 * | 4/2010 | Hsiao et al. .................... 438/29 |

FOREIGN PATENT DOCUMENTS

TW 201039406 11/2010

* cited by examiner

*Primary Examiner* — Angel Roman
(74) *Attorney, Agent, or Firm* — Justin King; WPAT PC

(57) ABSTRACT

A method for forming contact holes is applied in a transistor array substrate. The transistor array substrate includes first contact pads, second contact pads located over the first contact pads, a first insulation layer covering the first contact pads, and a second insulation layer covering the second contact pads. Firstly, a photoresist pattern layer having recesses and first openings is formed on the second insulation layer. The first openings expose the second insulation layer partially. Then, the first insulation layer and the second insulation layer inside the first openings are removed partially, to expose the first contact pads. Then, the thickness of the photoresist pattern layer is reduced, so that the recesses form a plurality of second openings which expose the second insulation layer partially. After that, a part of the second insulation layer which is located inside the second openings is removed, to expose the second contact pads.

11 Claims, 7 Drawing Sheets

METHOD FOR FORMING CONTACT HOLES

CROSS-REFERENCE TO RELATED APPLICATION

This application claims the benefit of Taiwan Patent Application No. 100129243, filed on Aug. 16, 2011, which is hereby incorporated by reference for all purposes as if fully set forth herein.

BACKGROUND OF THE INVENTION

1. Field of Invention

The present invention relates to a manufacturing process for displayers and more particularly to a method for forming contact holes.

2. Related Art

Transistor array substrate is an important and essential component for liquid crystal displays in the consumer market today. In a finished product of conventional transistor array substrate, by applying a plurality of contact holes, a plurality of drains of transistors can be electrically connected to a plurality of pixel electrodes respectively, and signal lines (such as scan lines or data lines) can be electrically connected to drivers.

A conventional transistor array substrate includes two insulation layers, and the contact holes are disposing inside the insulation layers. The contact holes are formed by penetrating at least one of the insulation layers. In other words, some contact holes are formed by penetrating all the insulation layers, or some of them are formed by penetrating one of the insulation layers. Therefore, the contact holes in the same transistor array substrate have different depths.

In general, the contact holes are formed by etching. However, the contact holes have different depths, and thus the drains and signal lines can possibly be damaged due to over-etching during the etching process, such that the transistor array substrate has to be reworked or scrapped. As a result, the manufacturing costs for transistor array substrate are increased.

SUMMARY OF THE INVENTION

The present invention provides a method for forming contact holes which can reduce the possibility of occurrence of the abovementioned over-etching.

The present invention provides a method for forming contact holes to be applied in a transistor array substrate. The transistor array substrate includes a substrate, a first metal pattern layer, a first insulation layer, a second metal pattern layer and a second insulation layer. The first metal pattern layer is disposed on the substrate and includes a plurality of first contact pads, and the first insulation layer covers the substrate and the first metal pattern layer. The second metal pattern layer is disposed on the first insulation layer and includes a plurality of second contact pads, and the second insulation layer covers the second metal pattern layer and the first insulation layer. The abovementioned method for forming contact holes is as follow. Firstly, a photoresist pattern layer having a plurality of recesses and a plurality of first openings is formed on the second insulation layer, wherein the first openings partially expose the second insulation layer, but the second insulation layer is not exposed by the recesses. The first openings are directly disposed above the first contact pads respectively, and the recesses are directly disposed above the second contact pads respectively. Then, the photoresist pattern layer is used as a mask, and the first insulation layer and the second insulation layer located inside the first openings are partially removed, in order to expose the first contact pads. Then, the thickness of the photoresist pattern layer is reduced, so that the recesses are formed to a plurality of second openings which partially exposes the second insulation layer. After that, the photoresist pattern layer having a reduced thickness is used as a mask, and a part of the second insulation layer located inside the second openings is removed so as to expose the second contact pads.

Based on the abovementioned, with the recesses and the first openings of the photoresist pattern layer, in the process of removing partially the second insulation layer and the first insulation layer, the photoresist pattern layer located on the bottom of the recesses can protect the second insulation layer below the recesses, so as to delay the starting time of forming the contact holes which expose the second contact pads. In this manner, the present invention can reduce the possibility of occurrence of over-etching, and thus the manufacturing costs of transistor array substrate are reduced.

The abovementioned characteristics and advantages of a method for forming contact holes of the present invention will become more fully understood by reference to the following detailed description thereof when read in conjunction with the attached drawings.

DETAILED DESCRIPTION OF THE INVENTION

Figure 1A:
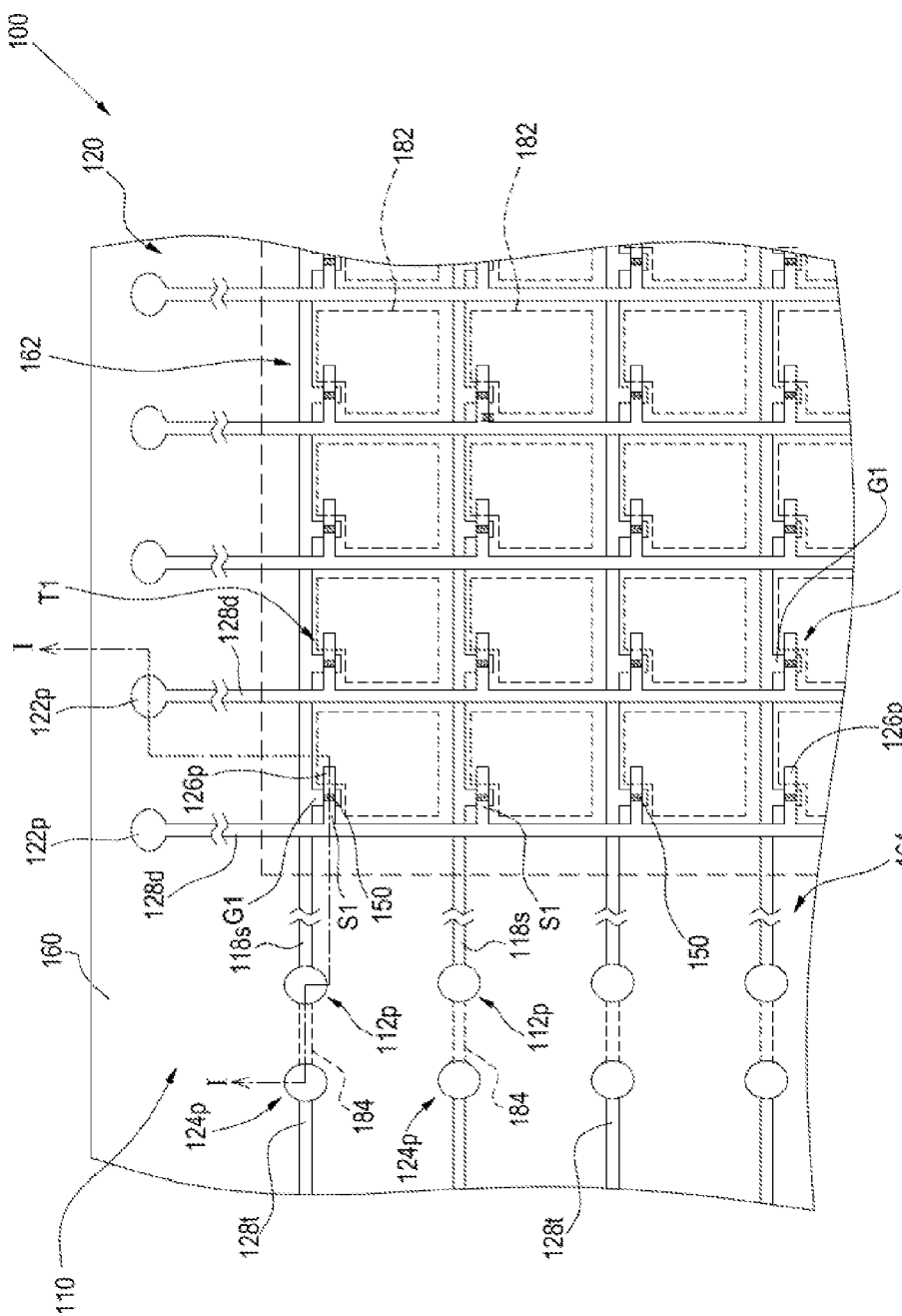
FIG. 1A is a planform view of a transistor array substrate according to a method for forming contact holes of an embodiment of the present invention.
Figure 1B:
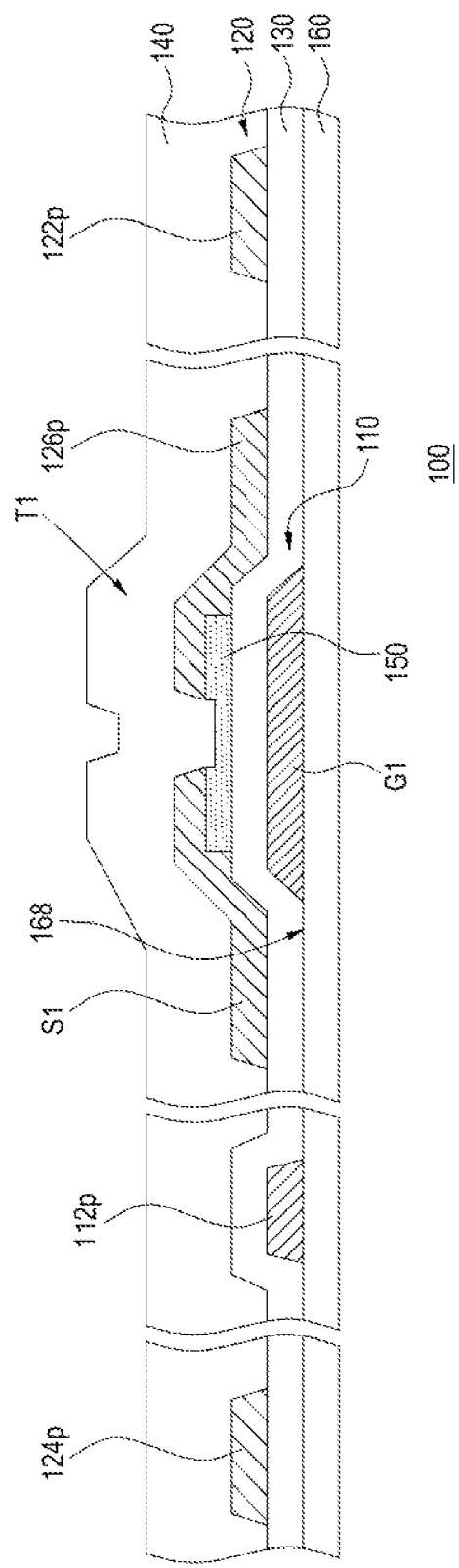
FIG. 1B is a cross sectional view of FIG. 1A along line I-I.

FIG. 1A is a planform view of a transistor array substrate according to a method for forming contact holes of an embodiment of the present invention. FIG. 1B is a cross sectional view of FIG. 1A along line I-I. Referring to FIGS. 1A and 1B, in this embodiment, a method for forming contact holes to be applied in a transistor array substrate 100, and a plurality of contact holes are formed on the transistor array substrate 100. The transistor array substrate 100 is a semi-finished product of a common transistor array substrate. The transistor array substrate 100 does not have any contact holes, pixel electrodes 182 and jumpers 184, before the abovementioned contact holes are formed.

The transistor array substrate 100 includes a first metal pattern layer 110, a second metal pattern layer 120, a first insulation layer 130, a second insulation layer 140, a plurality of semiconductor layers 150 and a substrate 160. All of the first metal pattern layer 110, the second metal pattern layer 120, the first insulation layer 130, the second insulation layer 140 and the semiconductor layers 150 are disposed above a plane 168 of the substrate 160.

The first metal pattern layer 110 is disposed on the substrate 160 and is in contact with the plane 168, and the first insulation layer 130 covers the plane 168 of the substrate 160 and the first metal pattern layer 110. The second metal pattern layer 120 is disposed on the first insulation layer 130, and the second insulation layer 140 covers the second metal pattern layer 120 and the first insulation layer 130. Therefore, the first metal pattern layer 110 is disposed between the first insulation layer 130 and the substrate 160, and the second metal pattern layer 120 is disposed between the first insulation layer 130 and the second insulation layer 140. The first metal pattern layer 110 is disposed below the second metal pattern layer 120.

The first metal pattern layer 110 and the second metal pattern layer 120 are made of molybdenum or molybdenum alloy, while the first insulation layer 130 and the second insulation layer 140 are made of silicon oxide ($SiO_x$), silicon nitride ($SiN_x$) or polymer materials; and silicon dioxide ($SiO_2$) is also applicable. The substrate 160 is a transparent substrate such as a glass substrate or sapphire substrate. The substrate 160 has a display area 162 and a non-display area 164, and the non-display area 164 is located beside the display area 162, shown in FIG. 1A.

The first metal pattern layer 110 includes a plurality of first contact pads 112p, and the second metal pattern layer 120 includes a plurality of second contact pads 122p, 124p and 126p. All of the first contact pads 112p and the second contact pads 122p and 124p are disposed in the non-display area 164, and the second contact pads 126p are disposed in the display area 162. Furthermore, the first contact pads 112p do not overlap the second contact pads 122p, 124p and 126p.

The first metal pattern layer 110 further includes a plurality of scan lines 118s, while the second metal pattern layer 120 further includes a plurality of data lines 128d. The scan lines 118s are disposed side by side with each other, and the data lines 128d are also disposed side by side with each other. The scan lines 118s and the data lines 128d intersect with each other, so that the scan lines 118s and the data lines 128d are arranged like a network as shown in FIG. 1A. Furthermore, the first contact pads 112p are connected to the scan lines 118s, and the second contact pads 122p are connected to the data lines 128d.

The semiconductor layers 150 are disposed between the first metal pattern layer 110 and the second metal pattern layer 120, and are disposed on the first insulation layer 130. The semiconductor layers 150 are made of polycrystalline silicon, amorphous silicon, or metal oxide semiconductors (MOS) such as indium-gallium-zinc-oxide semiconductor (In—Ga—Zn—O, IGZO) or indium-stannum-zinc-oxide semiconductor (In—Sn—Zn—O, ITZO).

The semiconductor layers 150, the first metal pattern layer 110, the first insulation layer 130 and the second metal pattern layer 120 can be formed to a plurality of transistors T1, and the transistors T1 can be field-effect transistors (FET). Therefore, each of the transistors T1 can have a source S1, a gate G1, a semiconductor layer 150 and a drain, wherein the drains are the second contact pads 126p.

The gates G1 are connected to the scan lines 118s, and the sources S1 are connected to the data lines 128d; therefore, the scan lines 118s can control the transistors T1 to be turned on or turned off, and the data lines 128d can transmit signals (such as pixel voltages) to the transistors T1.

The gates G1, the first contact pads 112p and the scan lines 118s can be formed by photolithography and etching a single metal layer, and the sources S1, the second contact pads 122p, 124p and 126p and the data lines 128d can also be formed by photolithography and etching of another single metal layer. Therefore, the gates G1, the first contact pads 112p and the scan lines 118s can be formed integrally, while the sources S1, the second contact pads 122p, 124p and 126p and the data lines 128d can also be formed integrally. This shows that the first metal pattern layer 110 further includes the gates G1, and the second metal pattern layer 120 further includes the sources S1.

It is worthy to mention that, as referring to FIGS. 1A and 1B, the transistors T1 are bottom-gate transistors because the gates G1 are disposed below the sources S1 and the drains (the second contact pads 126p), and the transistor array substrate 100 is substantially a bottom-gate transistor array substrate. However, the method for forming contact holes in this embodiment can also be embodied to top-gate transistor array substrates. Therefore, this embodiment of a method for forming contact holes can also be applicable in top-gate transistor array substrate, and not limited to be only suitable for bottom-gate transistor array substrates.

In addition, the second metal pattern layer 120 can also include a plurality of terminal wires 128t, the terminal wires 128t are disposed inside the non-display area 164, and the terminal wires 128t are connected to the second contact pads 124p as shown in FIG. 1A. The terminal wires 128t are used to electrically connect to at least one driver IC for transmitting electric signals outputted by the driver. The driver IC is, for example, a gate driver IC.

It is necessary to mention that, although only the second metal pattern layer 120 includes a plurality of the terminal wires 128t as shown in FIG. 1A and the first metal pattern layer 110 does not include any terminal wires, in other embodiments the second metal pattern layer 120 does not necessary include the terminal wires 128t, and the first metal pattern layer 110 can include a plurality of terminal wires for electrically connecting to the driver IC. The driver IC can be, for example, a gate driver IC or a source driver IC. Therefore, the terminal wires 128t shown in FIG. 1A are only for the purpose of description as an example, and not as a limitation thereof.

Figure 2A:
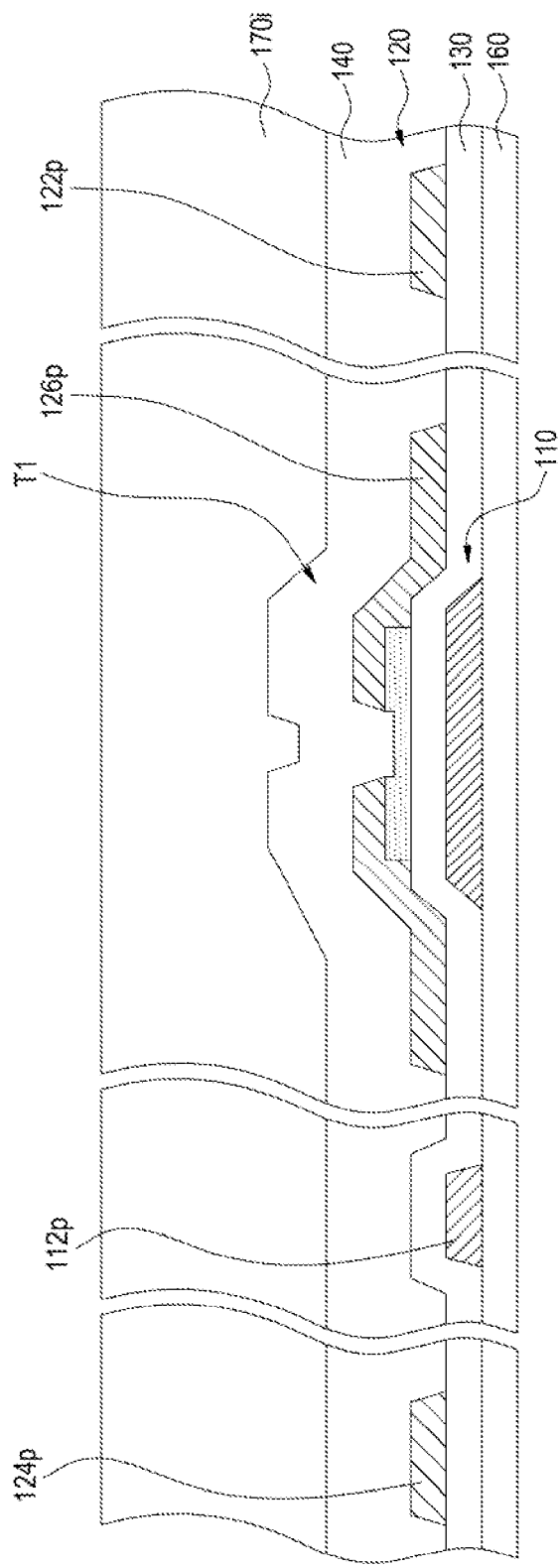
FIGS. 2A to 2E are cross sectional views of flow diagrams of a method for forming contact holes of an embodiment of the present invention.
Figure 2B:
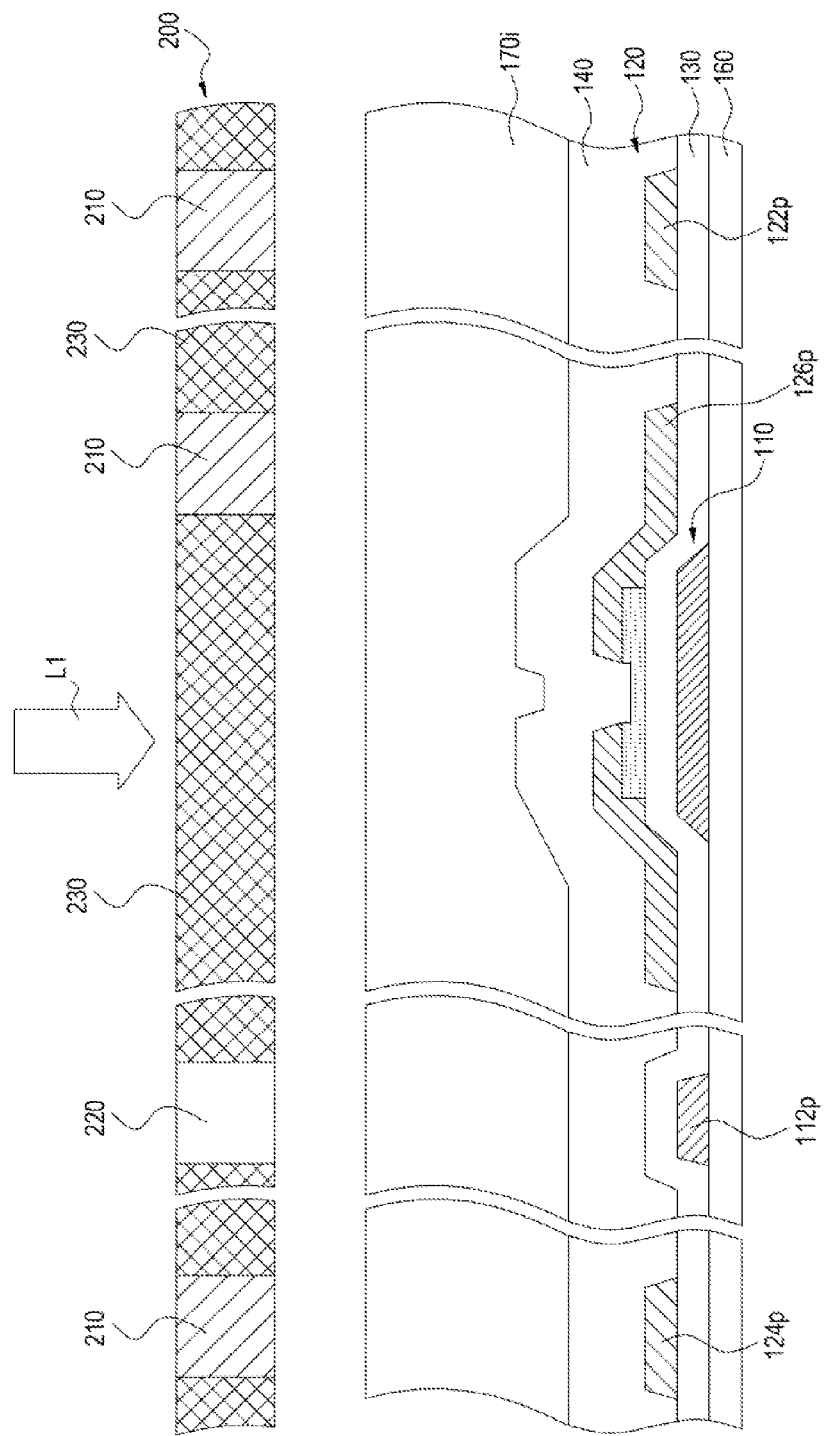
Figure 2C:
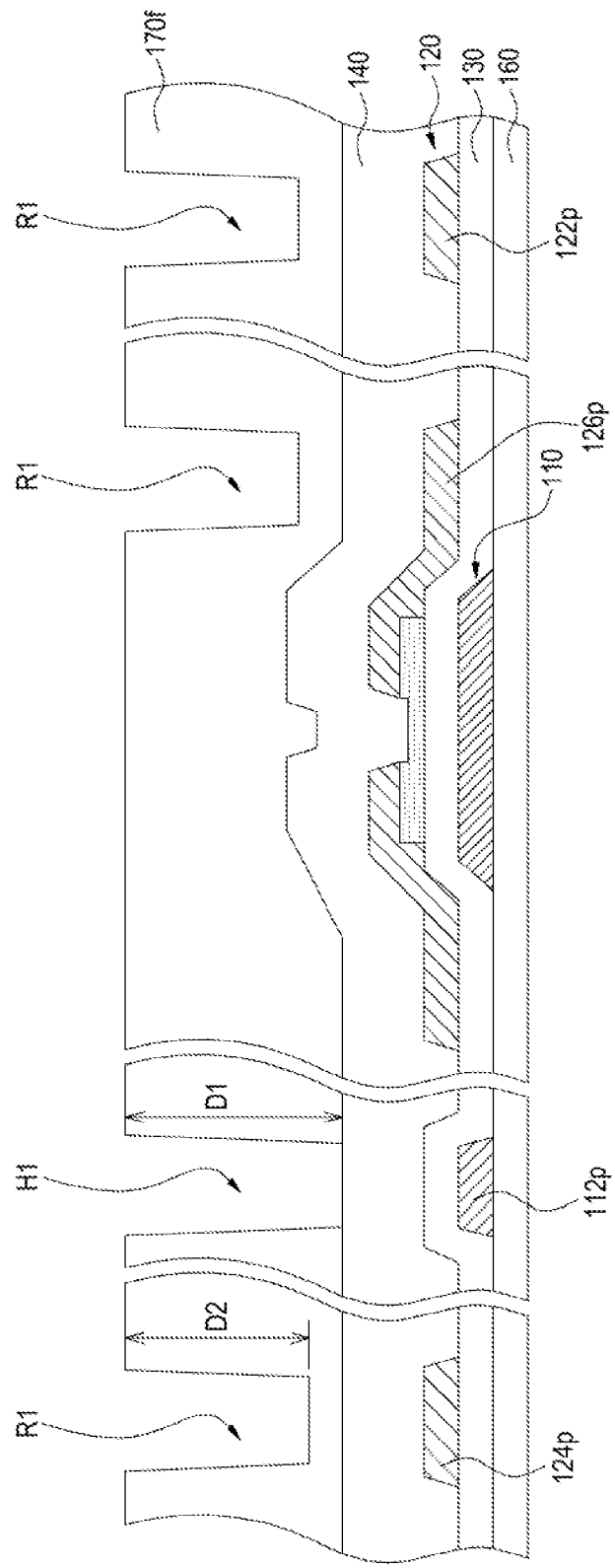

FIGS. 2A to 2E are cross sectional views of flow diagrams of a method for forming contact holes of an embodiment of the present invention. Please refer to FIGS. 2A to 2C, in this embodiment a method for forming contact holes is as follow. Firstly, a photoresist pattern layer 170f is formed on the second insulation layer 140 as shown in FIG. 2C, the second insulation layer 140 is partially exposed from the photoresist pattern layer 170f which has a plurality of recesses R1 and a plurality of first via holes H1. The photoresist pattern layer 170f is formed by a photolithography process, and the photolithography process includes exposure and development.

To be more detailed, please refer to FIG. 2A. A method for forming the photoresist pattern layer 170f is as follow. Firstly, an initial photoresist layer 170i is formed on the second insulation layer 140, wherein the second insulation layer 140 is entirely covered by the initial photoresist layer 170i. The initial photoresist layer 170i can be formed by a coating process, such as spin coating. Furthermore, the initial photoresist layer 170i can be a type of positive photoresist. However, the initial photoresist layer 170i can also be a type of negative photoresist in other embodiments.

Referring to FIG. 2B, then, a halftone mask 200 is used as a mask to expose the initial photoresist layer 170i. The halftone mask 200 has a plurality of semi light-permeable areas 210, a plurality of light-permeable areas 220 (only one is shown in FIG. 2B) and a plurality of light-impermeable areas 230. When the initial photoresist layer 170i is exposed by a light, the light L1 will penetrate through the semi light-permeable areas 210 and the light-permeable areas 220, but basically the light L1 will not penetrate through the light-impermeable areas 230. When the light L1 penetrates through the halftone mask 200, the light L1 will almost completely penetrate through the light-permeable areas 220, the semi light-permeable areas 210 will block the light L1 partially, and only part of the light L1 will be allowed to go through the semi light-permeable areas 210.

The light-permeable areas 220 are aligned with the first contact pads 112p, and the semi light-permeable areas 210 are aligned with the second contact pads 122*p*, 124*p* and 126*p*. Therefore, in the process of exposure, the light-permeable areas 220 are basically located over the first contact pads 112*p* respectively, and the semi light-permeable areas 210 are basically located over the second contact pads 122*p*, 124*p* and 126*p* respectively.

Furthermore, the shapes of the semi light-permeable areas 210 can be corresponding to the shapes of the second contact pads 122*p*, 124*p* and 126*p*, and the shapes of the light-permeable areas 220 can be corresponding to the shape of the first contact pads 112*p*. To be more detailed, the shapes of the semi light-permeable areas 210 are in accordance with the shapes of the second contact pads 122*p*, 124*p* and 126*p*, and the shape of the light-permeable areas 220 is in accordance with the shape of the first contact pads 112*p*.

Referring to FIG. 1A as an example, the shapes of the first contact pads 112*p* and the second contact pads 122*p* and 124*p* are circular, and the shapes of the second contact pads 126*p* are rectangular. Therefore, the shapes of the light-permeable areas 220 can be circular, the shapes of the semi light-permeable areas 210 which are aligned with the second contact pads 122*p* and 124*p* are circular, and the shapes of the semi light-permeable areas 210 which are aligned with the second contact pads 126*p* are rectangular.

Referring to FIGS. 2B and 2C, after the initial photoresist layer 170*i* is exposed by the light, the initial photoresist layer 170*i* is developed to form the photoresist pattern layer 170*f*. The initial photoresist layer 170*i* can be a positive photoresist, and thus part of the initial photoresist layer 170*i* which is exposed by the light L1 will be removed in the process of development. As a result, the recesses R1 and the first openings H1 are formed.

The semi light-permeable areas 210 only allow part of the light L1 to penetrate therethrough, the light L1 almost entirely penetrate through the light-permeable areas 220, and thus the intensity of the light L1 from the semi light-permeable areas 210 is lower than that of the light L1 from the light-permeable areas 220. Therefore, the first openings H1 and the recesses R1 are formed with different depths of D1 and D2 respectively. The depth D1 of the first openings H1 is larger than the depth D2 of the recesses R1. Furthermore, the first openings H1 expose the second insulation layer 140 partially, and the second insulation layer 140 is not exposed by the recesses R1, as shown in FIG. 2C.

It can be known that, the recesses R1 are formed via the semi light-permeable areas 210, while the openings H1 are formed via the light-permeable areas 220. Therefore, the openings H1 are located over the first contact pads 112*p* respectively, and the recesses R1 are located over the second contact pads 122*p*, 124*p* and 126*p* respectively. In other words, the first openings H1 are basically aligned with the first contact pads 112*p* respectively, and the recesses R1 are basically aligned with the second contact pads 122*p*, 124*p* and 126*p* respectively.

It is necessary to mention that, although the initial photoresist layer 170*i* and the photoresist pattern layer 170*f* shown in FIGS. 2A to 2C are positive photoresists, the initial photoresist layer 170*i* and the photoresist pattern layer 170*f* can be negative photoresists in other embodiments. Therefore, during the process of development, part of the initial photoresist layer 170*i* which is not exposed by the light L1 can be removed, and part of the initial photoresist layer 170*i* which is exposed by the light L1 can be kept. Thus, the method for forming the photoresist pattern layer 170*f* shown in FIGS. 2A to 2C is only for description as an example, but not as a limitation thereof.

Figure 2D:
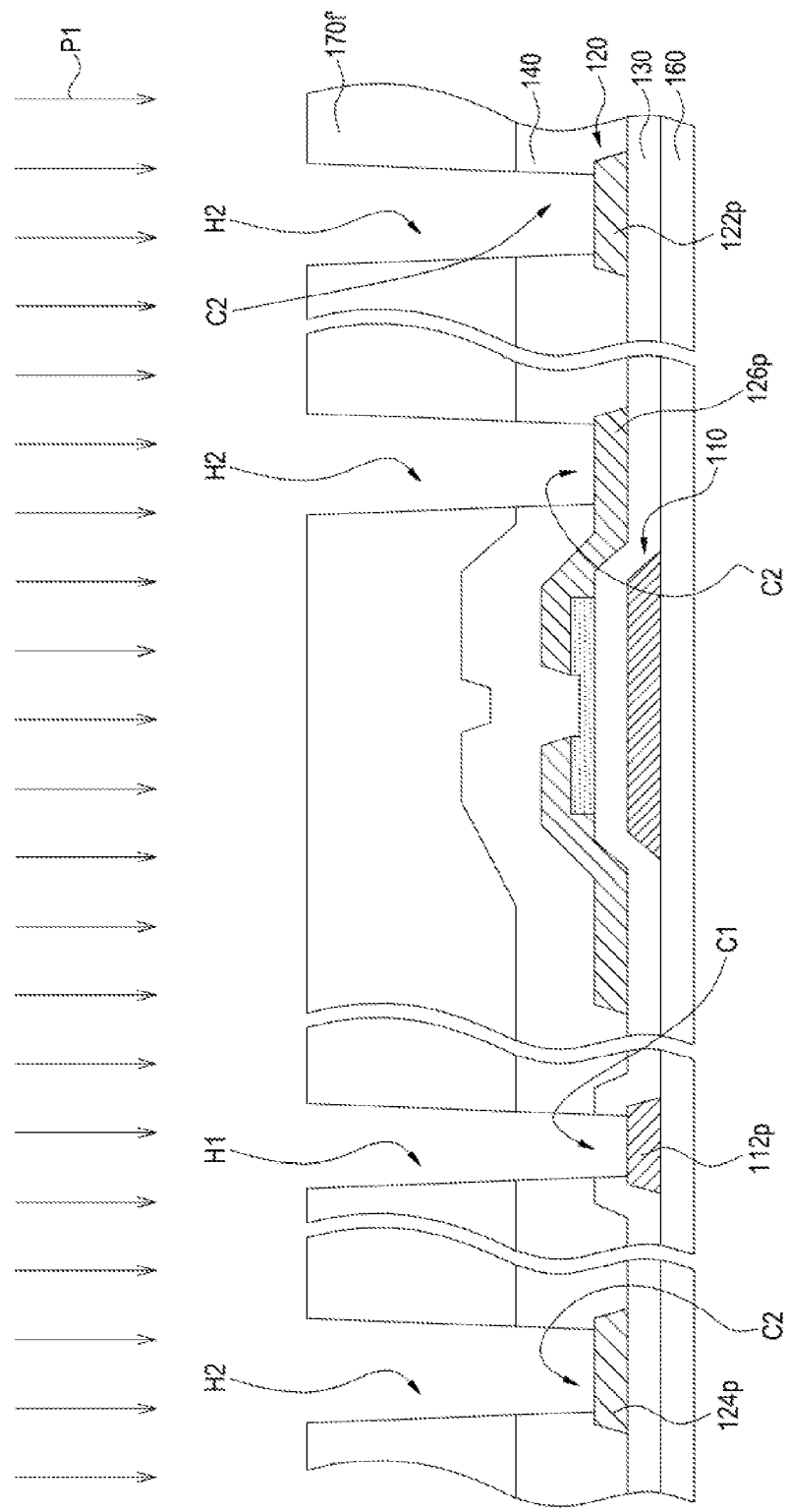

Referring to FIGS. 2C and 2D, then the photoresist pattern layer 170*f* is used as a mask, and the second insulation layer 140 and the first insulation layer 130 inside the first openings H1 are removed partially, in order to expose the first contact pads 112*p*. Thus, a plurality of contact holes C1 which expose the first contact pads 112*p* are formed.

In the embodiment shown in FIG. 2D, the method for removing partially the second insulation layer 140 and the first insulation layer 130 can be dry etching. Therefore, the second insulation layer 140 and the first insulation layer 130 can be removed by a plasma P1. The plasma P1 can be formed by electron bombardment of a gas. Thus, the gas molecules are broken down to produce free radicals and sequentially the plasma P1 is formed.

The plasma P1 includes fluoride ions, and fluoride ions can be produced by sulfur hexafluoride (SF6) or tetrafluoromethane (CF4). Therefore, the abovementioned gas which is bombarded by electrons includes at least one of the molecules of sulfur hexafluoride (SF6) and tetrafluoromethane (CF4). Fluoride ions can be produced by using electrons to dissociate the molecules of sulfur hexafluoride (SF6) or tetrafluoromethane (CF4).

When the second insulation layer 140 and the first insulation layer 130 inside the first openings H1 are removed partially, the thickness of the photoresist pattern layer 170*f* is reduced, and sequentially a photoresist pattern layer 170*f'* (as shown in FIG. 2D) is formed with a thickness thinner than the thickness of the photoresist pattern layer 170*f*. The photoresist pattern layer 170*f'* not only has a plurality of the first openings H1, but also has a plurality of second openings H2. The second openings H2 are formed by removing the photoresist pattern layer 170*f* located on the bottom of the recesses R1. Therefore, the second openings H2 are formed by the recesses R1, and the second insulation layer 140 is partially exposed by the second openings H2.

The thickness of the photoresist pattern layer 170*f* can be reduced by ashing of the plasma P1. To be more detailed, when the plasma P1 is used to remove partially the second insulation layer 140 and the first insulation layer 130, not only the second insulation layer 140 and the first insulation layer 130 can be removed, but also the photoresist pattern layer 170*f* can be partially removed. Thereby, the thickness of the photoresist pattern layer 170*f* is reduced, in order to form the photoresist pattern layer 170*f'*. In this embodiment, the photoresist pattern layer 170*f* can be easily ashed by oxygen ions, and therefore the plasma P1 also includes oxygen ions for ashing of the photoresist pattern layer 170*f*. Oxygen ions can be produced by using electrons to dissociate the molecules of oxygen.

After the second openings H2 are formed, the photoresist pattern layer 170*f'* having a reduced thickness is used as a mask to remove partially the second insulation layer 140 inside the second openings H2, in order to expose the second contact pads 122*p*, 124*p* and 126*p*. Thus, a plurality of contact holes C2 which expose the second contact pads 122*p*, 124*p* and 126*p* is formed. The method for removing partially the second insulation layer 140 can be dry etching. For instance, employ the plasma P1 to remove partially the second insulation layer 140 inside the second openings H2.

Since the first openings H1 expose the second insulation layer 140 partially and the second insulation layer 140 is not exposed by the recesses R1, when the second insulation layer 140 and the first insulation layer 130 are partially removed by the plasma P1, the photoresist pattern layer 170*f* located on the bottom of the recesses R1 can temporarily obstruct the removal of the second insulation layer 140 located on the bottom of the recesses R1 by the plasma P1, so that the starting time for forming the contact holes C2 is later than that of the contact holes C1. Sequentially, the contact holes C1 and the contact holes C2 with different depths (D1 and D2) are formed. Thus, the possibility of overetching the second contact pads 122p, 124p and 126p is reduced.

Furthermore, since the plasma P1 can remove a part of the second insulation layer 140 and the first insulation layer 130 inside the first openings H1 and a part of the second insulation layer 140 and the photoresist pattern layer 170f inside the second openings H2, in this embodiment the processes for forming the contact holes C1 and the contact holes C2 and the process for ashing the photoresist pattern layer 170f can be carried out in the same chamber. Thus the manufacturing process is simplified.

It is necessary to mention that, in the embodiment shown in FIG. 2D, the second insulation layer 140 and the first insulation layer 130 are partially removed by the plasma P1, and sequentially the contact holes C1 and C2 are formed. In other embodiments, the second insulation layer 140 and the first insulation layer 130 can be partially removed by etching liquid. In other words, the method for removing partially the second insulation layer 140 and the first insulation layer 130 can be a wet etching process, and sequentially the contact holes C1 and C2 are formed. Therefore, the plasma P1 shown in FIG. 2D is only for description as an example, but not as a limitation of methods for removing partially the second insulation layer 140 and the first insulation layer 130.

Figure 2E:
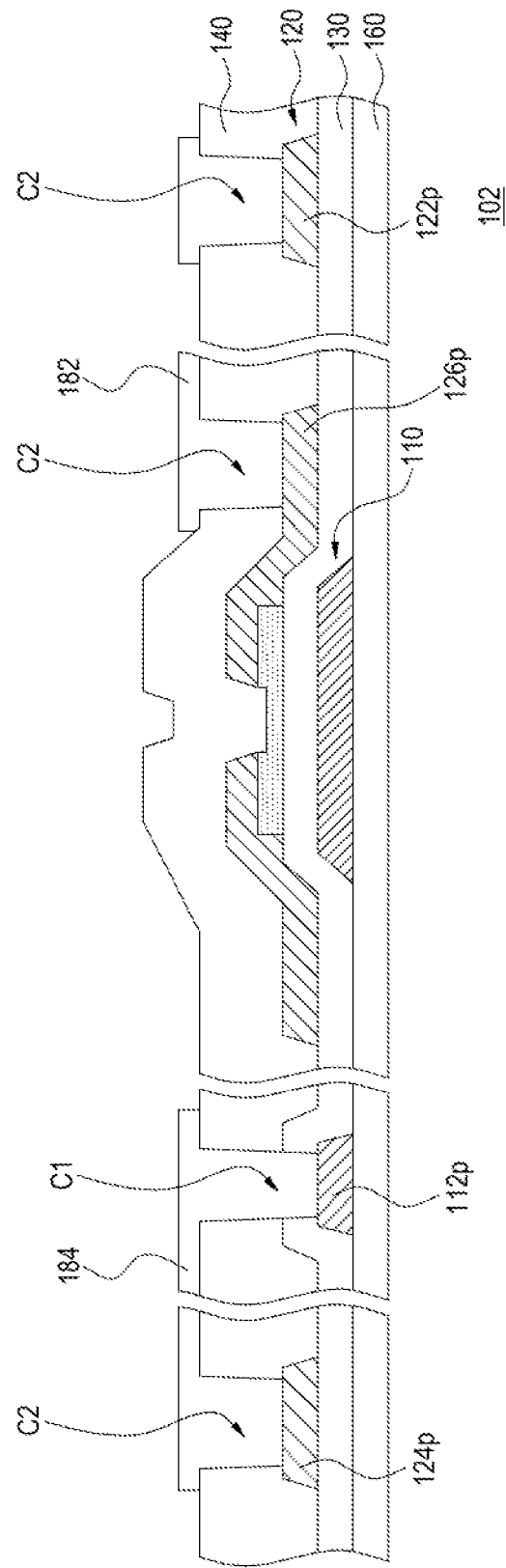

Referring to FIGS. 1A and 2E, after the contact holes C1 and the contact holes C2 are formed, the photoresist pattern layer 170f' is removed to expose the second insulation layer 140. Then, a plurality of pixel electrodes 182 and a plurality of jumpers 184 can be formed on the second insulation layer 140. The pixel electrodes 182 and the jumpers 184 are made of materials such as indium tin oxide (ITO) or indium zinc oxide (IZO). As a result, a transistor array substrate 102 which includes a plurality of contact holes C1 and C2, a plurality of pixel electrodes 182 and a plurality of jumpers 184, has been basically manufactured.

To summarize the above, the photoresist pattern layer has a plurality of recesses which do not expose the second insulation layer, and a plurality of the first openings which partially expose the second insulation layer, and thus during the process of removing partially the second insulation layer and the first insulation layer, the photoresist pattern layer located on the bottom of the recesses can protect the second insulation layer below the recesses, in order to delay the starting time for forming the contact holes which will expose the second contact pads. Therefore, when the contact holes which will expose the first contact pads start to form, the contact holes which will expose the second contact pads have not started to be formed yet. Therefore, the possibility of occurrence of overetching is reduced, and sequentially the manufacturing costs of the transistor array substrates are reduced.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A method for forming contact holes, the contact holes applied in a transistor array substrate, the transistor array substrate comprising a substrate, a first metal pattern layer, a first insulation layer, a second metal pattern layer and a second insulation layer, wherein the first metal pattern layer is disposed on the substrate, the first metal pattern layer includes a plurality of first contact pads, the first insulation layer covers the substrate and the first metal pattern layer, the second metal pattern layer is disposed on the first insulation layer, the second metal pattern layer includes a plurality of second contact pads, and the second insulation layer covers the second metal pattern layer and the first insulation layer, the method for forming contact holes comprising the following steps:

forming a photoresist pattern layer on the second insulation layer, wherein the photoresist pattern layer comprises a plurality of recesses and a plurality of first openings, the first openings expose the second insulation layer partially, and the second insulation layer is not exposed by the recesses, the first openings are located over the first contact pads respectively, and the recesses are located over the second contact pads respectively;

using the photoresist pattern layer as a mask, and remove partially the second insulation layer and the first insulation layer inside the first openings, in order to expose the first contact pads;

reducing the thickness of the photoresist pattern layer, so that the recesses form a plurality of second openings, wherein the second openings expose the second insulation layer partially; and using the photoresist pattern layer having a reduced thickness as a mask, and removing a part of the second insulation layer inside the second openings, so as to expose the second contact pads.

2. The method for forming contact holes as claimed in claim 1, wherein a step of forming the photoresist pattern layer comprises:

forming an initial photoresist layer on the second insulation layer;

using a halftone mask as a mask to expose the initial photoresist layer, wherein the halftone mask has a plurality of semi light-permeable areas, and the semi light-permeable areas are aligned with the second contact pads; and developing the initial photoresist layer after the initial photoresist layer is exposed by a light.

3. The method for forming contact holes as claimed in claim 2, wherein the halftone mask further comprises a plurality of light-permeable areas, and the light-permeable areas are aligned with the first contact pads.

4. The method for forming contact holes as claimed in claim 1, wherein a step of reducing the thickness of the photoresist pattern layer comprises a plasma ashing the photoresist pattern layer.

5. The method for forming contact holes as claimed in claim 4, wherein the plasma removes a part of the second insulation layer and the first insulation layer inside the first openings, and a part of the second insulation layer inside the second openings.

6. The method for forming contact holes as claimed in claim 5, wherein the plasma comprises oxygen ions and fluoride ions.

7. The method for forming contact holes as claimed in claim 1, wherein the transistor array substrate further comprises a plurality of semiconductor layers, the semiconductor layers are located between the first metal pattern layer and the second metal pattern layer, and the semiconductor layers, the first metal pattern layer, the first insulation layer and the second metal pattern layer form a plurality of transistors.

8. The method for forming contact holes as claimed in claim 7, wherein each of the transistors has a drain, and the drains are a plurality of the second contact pads.

9. The method for forming contact holes as claimed in claim 8, wherein the second metal pattern layer further comprises a plurality of data lines, and parts of the second contact pads are connected to the data lines.

10. The method for forming contact holes as claimed in claim 1, wherein the first metal pattern layer further comprises a plurality of scan lines, and the substrate has a display area and a non-display area, the non-display area is located beside the display area, and the first contact pads are connected to the scan lines and are located inside the non-display area.

11. The method for forming contact holes as claimed in claim 10, wherein the second metal pattern layer further comprises a plurality of terminal wires, the terminal wires are located inside the non-display area, and parts of the second contact pads are connected to the terminal wires and are disposed inside the non-display area.

* * * * *